US012615059B2

(12) United States Patent
Gupta et al.

(10) Patent No.: US 12,615,059 B2
(45) Date of Patent: Apr. 28, 2026

(54) LOW-LATENCY DELTA-SIGMA MODULATOR

(71) Applicant: TEXAS INSTRUMENTS INCORPORATED, Dallas, TX (US)

(72) Inventors: Amit Gupta, Frisco, TX (US); Maciej Jankowski, Munich (DE); Shawn Yu, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 71 days.

(21) Appl. No.: 18/524,778

(22) Filed: Nov. 30, 2023

(65) Prior Publication Data

US 2025/0183910 A1     Jun. 5, 2025

(51) Int. Cl.
*H03M 3/00*          (2006.01)

(52) U.S. Cl.
CPC ........... *H03M 3/496* (2013.01); *H03M 3/324* (2013.01)

(58) Field of Classification Search
CPC .............................. H03M 3/496; H03M 3/324
USPC ......................................................... 341/143
See application file for complete search history.

(56) References Cited

U.S. PATENT DOCUMENTS

| | | | | | |
|---|---|---|---|---|---|
| 5,712,635 A | * | 1/1998 | Wilson | ................... | H03H 17/06 |
| | | | | | 341/123 |
| 5,729,483 A | * | 3/1998 | Brown | .................. | G06T 3/4007 |
| | | | | | 708/319 |
| 5,892,468 A | * | 4/1999 | Wilson | ............... | H03H 17/0628 |
| | | | | | 341/61 |
| 6,323,794 B1 | * | 11/2001 | Okuda | .................. | H03M 3/414 |
| | | | | | 341/143 |
| 6,326,912 B1 | * | 12/2001 | Fujimori | ............... | H03M 3/412 |
| | | | | | 341/172 |
| 7,034,730 B2 | * | 4/2006 | Siferd | ................... | H03M 3/344 |
| | | | | | 341/143 |
| 7,365,669 B1 | * | 4/2008 | Melanson | ........ | G10K 11/17819 |
| | | | | | 704/E21.014 |
| 8,638,225 B1 | * | 1/2014 | Bocko | ..................... | G07C 3/00 |
| | | | | | 702/159 |
| 9,780,803 B1 | * | 10/2017 | Bal | ..................... | H03M 1/1071 |
| 10,033,403 B1 | * | 7/2018 | Thiagarajan | ....... | H03H 17/0416 |
| 10,348,326 B2 | * | 7/2019 | Bach | ................. | H03H 17/0416 |
| 12,126,363 B2 | * | 10/2024 | Das | ..................... | H03M 7/3022 |
| 2004/0150543 A1 | * | 8/2004 | Wang | ................... | H03M 3/338 |
| | | | | | 341/143 |
| 2014/0207979 A1 | * | 7/2014 | Wu | ......................... | G06F 13/28 |
| | | | | | 710/22 |

(Continued)

*Primary Examiner* — Zhen Y Wu

(74) *Attorney, Agent, or Firm* — Xianghui Huang; Frank D. Cimino

(57)          ABSTRACT

A circuit includes: multi-bit analog-to-digital conversion circuitry; an interpolation circuit; a filter; and a digital delta-sigma modulator. The multi-bit analog-to-digital conversion circuitry has a first terminal and a second terminal. The interpolation circuit has a first terminal and a second terminal. The first terminal of the interpolation circuit is coupled to the second terminal of the multi-bit analog-to-digital conversion circuitry. The filter has a first terminal and a second terminal. The first terminal of the filter is coupled to the second terminal of the interpolation circuit. The digital delta-sigma modulator has a first terminal and a second terminal. The first terminal of the digital delta-sigma modulator is coupled to the second terminal of the filter.

20 Claims, 5 Drawing Sheets

(56)                    References Cited

U.S. PATENT DOCUMENTS

2019/0123762  A1 *    4/2019   Bach .................... H03M 3/496

* cited by examiner

500

FULL-SCALE
STEP RESPONSE 500 mV/DIV
504

500 mV/DIV
506

200 mV/DIV
502

TIME (2 μs/div)

600

614 | 616

HIGH-VOLTAGE DOMAIN | LOW-VOLTAGE DOMAIN

V_Isense1

ISOLATED
AMPLIFIER

V_Isense2

MONITORED
COMPONENT
602

606

302

304

610

CONTROLLER
608

300B

CS2

DIGITAL
ISOLATOR

CS1

604

624

622

612

620

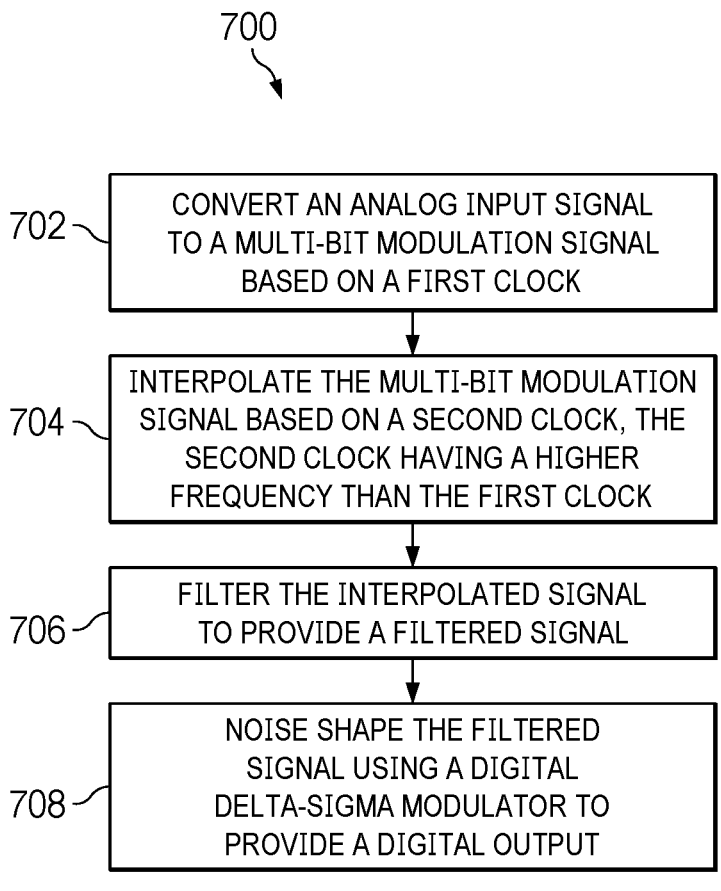

700

702 — CONVERT AN ANALOG INPUT SIGNAL TO A MULTI-BIT MODULATION SIGNAL BASED ON A FIRST CLOCK

704 — INTERPOLATE THE MULTI-BIT MODULATION SIGNAL BASED ON A SECOND CLOCK, THE SECOND CLOCK HAVING A HIGHER FREQUENCY THAN THE FIRST CLOCK

706 — FILTER THE INTERPOLATED SIGNAL TO PROVIDE A FILTERED SIGNAL

708 — NOISE SHAPE THE FILTERED SIGNAL USING A DIGITAL DELTA-SIGMA MODULATOR TO PROVIDE A DIGITAL OUTPUT

FIG. 7

LOW-LATENCY DELTA-SIGMA MODULATOR

BACKGROUND

Control systems rely on different components and interfaces to relay data and/or control signals between sensors, controllers, and controlled components. In some examples, the sensors, controllers, and controlled components reside in different voltage domains. Example components that may be used in a control system to facilitate transfer of data and/or control signals include isolated modulators and isolated amplifiers. The latency of isolated modulators and isolated amplifiers affects the performance of related control systems and simply increasing the clock rates of related components is challenging due to harsher settling requirements.

SUMMARY

In an example, circuit includes: multi-bit analog-to-digital conversion circuitry; an interpolation circuit; a filter; and a digital delta-sigma modulator. The multi-bit analog-to-digital conversion circuitry has a first terminal and a second terminal. The interpolation circuit has a first terminal and a second terminal. The first terminal of the interpolation circuit is coupled to the second terminal of the multi-bit analog-to-digital conversion circuitry. The filter has a first terminal and a second terminal. The first terminal of the filter is coupled to the second terminal of the interpolation circuit. The digital delta-sigma modulator has a first terminal and a second terminal. The first terminal of the digital delta-sigma modulator is coupled to the second terminal of the filter.

In another example, a circuit includes: a multi-bit delta-sigma modulator having a first terminal and a second terminal; an interpolation circuit having a first terminal and a second terminal; a filter having a first terminal and a second terminal; a digital delta-sigma modulator having a first terminal and a second terminal; and isolation circuitry having a first terminal and a second terminal. The first terminal of the interpolation circuit is coupled to the second terminal of the multi-bit delta-sigma modulator. The first terminal of the filter coupled to the second terminal of the interpolation circuit. The first terminal of the digital delta-sigma modulator coupled to the second terminal of the filter. The first terminal of the isolation circuitry coupled to the second terminal of the digital delta-sigma modulator.

In yet another example, a circuit includes: multi-bit analog-to-digital conversion circuitry; an interpolation circuit coupled to the multi-bit analog-to-digital conversion circuitry; a filter coupled to the interpolation circuit; and a digital delta-sigma modulator coupled to the filter. The multi-bit analog-to-digital conversion circuitry is configured to convert an analog input signal to a multi-bit signal. The interpolation circuit is configured to interpolate the multi-bit signal, resulting in an interpolated signal. The filter is configured to filter the interpolated signal, resulting in a filtered signal. The digital delta-sigma modulator is configured to digitize the filtered signal.

BRIEF DESCRIPTION OF THE DRAWINGS

FIG. 7 is a flowchart showing an example delta-sigma modulator method.

DETAILED DESCRIPTION

Figures 1A, 1B:
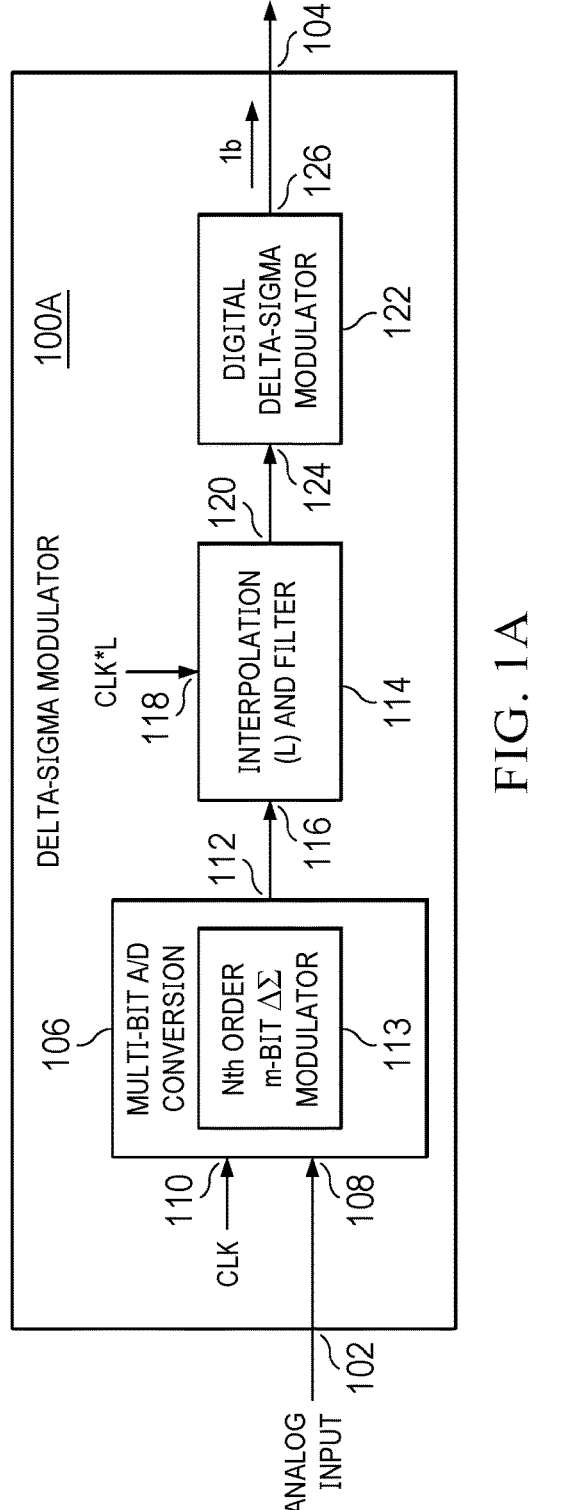
FIG. 1A is a block diagram showing an example delta-sigma modulator circuit.
FIG. 1B is a block diagram showing another example delta-sigma modulator circuit.

The same reference numbers or other reference designators are used in the drawings to designate the same or similar features. Such features may be the same or similar either by function and/or structure.

Described herein are low-latency delta-sigma modulator topologies and related circuits. FIG. 1A is a block diagram showing an example delta-sigma modulator circuit 100A. The delta-sigma modulator circuit 100A has a first terminal 102 and a second terminal 104. The delta-sigma modulator circuit 100A includes multi-bit analog-to-digital conversion circuitry 106, interpolation and filter circuitry 114, and a digital delta-sigma modulator 122. The multi-bit analog-to-digital conversion circuitry 106 has a first terminal 108, a second terminal 110, and a third terminal 112. In some examples, the multi-bit analog-to-digital conversion circuitry 106 includes an Nth order m-bit delta-sigma modulator 113. The interpolation and filter circuitry 114 has a first terminal 116, a second terminal 118, and a third terminal 120. The digital delta-sigma modulator 122 has a first terminal 124 and a second terminal 126.

The first terminal 102 of the delta-sigma modulator circuit 100A is coupled to the first terminal 108 of the multi-bit analog-to-digital conversion circuitry 106. The second terminal 110 of the multi-bit analog-to-digital conversion circuitry 106 is coupled to a clock generator (not shown) and receives a clock signal (CLK). The third terminal 112 of the multi-bit analog-to-digital conversion circuitry 106 is coupled to the first terminal 116 of the interpolation and filter circuitry 114. The second terminal 118 of the interpolation and filter circuitry 114 is coupled to a clock generator or multiplier (not shown) and receives an interpolation clock signal (e.g., CLK*L), where L is an integer greater than 1. The third terminal 120 of the interpolation and filter circuitry 114 is coupled to the first terminal 124 of the digital delta-sigma modulator 122. The second terminal 126 of the digital delta-sigma modulator 122 is coupled to the second terminal 104 of the delta-sigma modulator circuit 100A.

The multi-bit analog-to-digital conversion circuitry 106 operates to: receive an analog input signal at the first terminal 108; receive CLK at the second terminal 110; and output a modulated signal responsive to the analog input signal, CLK, and multi-bit analog-to-digital conversion operations. In some examples, the analog-to-digital conversion operations are performed by the Nth order m-bit delta-sigma modulator 113.

An example first-order delta-sigma modulator includes a subtract block, an integrator, a comparator, and a 1-bit digital-to-analog converter (DAC). The first-order delta-sigma modulator runs off of the input clock (e.g., CLK herein), which determines the sampling interval of the input. The modulation loop begins by integrating the difference between the input sample and the 1-bit DAC. The comparator determines the next modulator output based on the integrator value. Depending on the output state of the comparator, the 1-bit DAC produces a voltage equal to the positive or negative reference voltage of the first-order delta-sigma modulator. If the modulator output is a 1, the reference voltage is subtracted from the input. If the output is a 0, the reference voltage is added to the input voltage.

At every modulator clock pulse, the modulator completes a full cycle and generates a new output. As the modulator clock continues to run, each modulator clock pulse generates another modulator output pulse. The resulting output bit stream becomes a representation of the input voltage, proportional to the reference voltage. As the analog input signal approaches a positive range threshold, the modulator's bit stream approaches a 1 s density of 100%. Conversely, as the analog input signal approaches a negative range threshold, the bit stream 1 s density approaches 0%. When the analog input signal is 0 V, the 1 s density is 50%.

A single-bit modulator suffers from undesirable quantization noise. Adding an integrator before the comparator as in the example above provides first order shaping of quantization noise. The useful bandwidth obtained with a first-order, single-bit modulator is quite limited. Increasing the order of the modulator by adding more integrators is one way to increase usable bandwidth. A Nth order modulator provides Nth order shaping of quantization noise. An example m-bit quantizer has $2^m$ comparators. Using more levels in the quantizer instead of a single comparator directly reduces quantization noise. The quantization noise drops by 6 dB every time the number of comparators is doubled. Multi-bit modulators allow more useful bandwidth compared to single-bit modulators clocked at same frequency. In some examples, the Nth order m-bit delta-sigma modulator 113 may be a third-order 5-bit delta-sigma modulator.

The interpolation and filter circuitry 114 operates to: receive the modulated signal at the first terminal 116; receive the interpolation clock signal at the second terminal 118; interpolate the modulated signal responsive to the interpolation clock signal to obtain interpolation results; filter the interpolation results using a low-pass filter (LPF) to obtain filtered results; and provide the filtered results at the third terminal 120. The upsampling of the signal by interpolation factor L creates unwanted images in the spectrum. The LPF removes these images. However, the LPF adds delay, so there is a tradeoff between image rejection and delay in the modulator. The digital delta-sigma modulator operates to: receive the filtered results at the first terminal 124; digitize the filtered results to provide a digital output; and provide the digital output at the second terminal 126. The digital output is provided to the second terminal 104 of the delta-sigma modulator circuit 100A. In some examples, the digital output is a stream of 1-bit digital values. With the delta-sigma modulator circuit 100A, the combination of the multi-bit analog-to-digital conversion circuitry 106, the interpolation and filter circuitry 114, and the digital delta-sigma modulator 122 provide a high-speed (low-latency) delta-sigma modulator, where the speed has been increased by a factor of L without increasing CLK.

FIG. 1B is a block diagram showing another example delta-sigma modulator circuit 100B. The delta-sigma modulator circuit 100B has the first terminal 102 and the second terminal 104 described in FIG. 1A. The delta-sigma modulator circuit 100B includes multi-bit analog-to-digital conversion circuitry 128, the interpolation and filter circuitry 114, and the digital delta-sigma modulator 122. The multi-bit analog-to-digital conversion circuitry 128 has a first terminal 130, a second terminal 132, and a third terminal 134. In some examples, multi-bit analog-to-digital conversion circuitry 128 includes a Nyquist rate analog-to-digital converter (ADC) 135. The interpolation and filter circuitry 114 has the first terminal 116, the second terminal 118, and the third terminal 120 described in FIG. 1A. The digital delta-sigma modulator 122 has the first terminal 124 and the second terminal 126 described in FIG. 1A.

The first terminal 102 of the delta-sigma modulator circuit 100B is coupled to the first terminal 130 of the multi-bit analog-to-digital conversion circuitry 128. The second terminal 132 of the multi-bit analog-to-digital conversion circuitry 128 is coupled to a clock generator (not shown) and receives CLK. The third terminal 134 of the multi-bit analog-to-digital conversion circuitry 128 is coupled to the first terminal 116 of the interpolation and filter circuitry 114. The second terminal 118 of the interpolation and filter circuitry 114 is coupled to a clock generator or multiplier (not shown) and receives an interpolation clock signal (e.g., CLK*L), where L is an integer greater than 1. The third terminal 120 of the interpolation and filter circuitry 114 is coupled to the first terminal 124 of the digital delta-sigma modulator 122. The second terminal 126 of the digital delta-sigma modulator 122 is coupled to the second terminal 104 of the delta-sigma modulator circuit 100B.

The multi-bit analog-to-digital conversion circuitry 128 operates to: receive an analog input signal at the first terminal 130; receive CLK at the second terminal 132; and output a modulated signal responsive to the analog input signal, CLK, and multi-bit analog-to-digital conversion operations. In some examples, the analog-to-digital conversion operations are performed by the Nyquist rate ADC 135.

An example Nyquist rate ADC 135 may be a successive-approximation (SAR) ADC that includes a sample-and-hold circuit, an analog comparator, successive approximation register, and a N-bit search digital-to-analog converter (DAC). During a sampling phase, the sample-and-hold circuit charges a capacitor to the analog input signal level to within a target resolution (e.g., half of a least significant bit resolution). After the sampling phase, the sample-and-hold circuit provides the sampled voltage to a first terminal (e.g., the non-inverting terminal) of the analog comparator. A second terminal of the analog comparator receives the output of the N-bit search DAC. The N-bit search DAC and the analog comparator successively compare the sampled voltage to outputs of the N-bit search DAC outputs (e.g., most significant to least significant), where the comparison results are stored in the successive approximation register. The Nyquist rate ADC 135 in the example above provides an N-bit output in one CLK period. Thus, the internal SAR search uses a clock faster than CLK. In other examples, the Nyquist rate ADC 135 can be any other Nyquist rate ADC architecture providing N-bit data in one CLK period.

The interpolation and filter circuitry 114 and the digital delta-sigma modulator 122 in FIG. 1B operate as described for FIG. 1A. The digital output from the digital delta-sigma modulator 122 is provided to the second terminal 104 of the delta-sigma modulator circuit 100B. With the delta-sigma modulator circuit 100B, the combination of multi-bit analog-to-digital conversion circuitry 128, the interpolation and filter circuitry 114, and the digital delta-sigma modulator 122 provide a high-speed (low-latency) single-bit modulator, where the speed has been increased by a factor of L without increasing CLK.

In some examples, the delta-sigma modulator circuit 100A or 100B may be part of an isolated modulator circuit. In other examples, the delta-sigma modulator circuit 100A or 100B may be part of an isolated amplifier circuit.

Figures 2, 3:
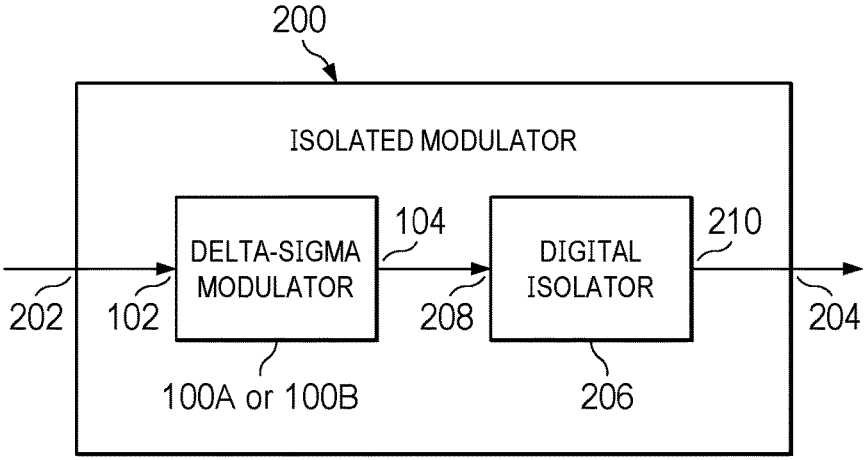
FIG. 2 is a block diagram showing an example isolated modulator circuit.
FIG. 3 is a block diagram showing an example isolated amplifier circuit.

FIG. 2 is a block diagram showing an example isolated modulator circuit 200. The isolated modulator circuit 200 has a first terminal 202 and a second terminal 204. The isolated modulator circuit 200 includes the delta-sigma modulator circuit 100A or 100B and digital isolator circuitry 206. The delta-sigma modulator circuit 100A or 100B has the first terminal 102 and the second terminal described in FIGS. 1A and 1B. The digital isolator circuitry 206 has a first terminal 208 and a second terminal 210.

The first terminal 202 of the isolated modulator circuit 200 is coupled to the first terminal 102 of the delta-sigma modulator circuit 100A or 100B. The second terminal 104 of the delta-sigma modulator circuit 100A or 100B is coupled to the first terminal 208 of the digital isolator circuitry 206. The second terminal 210 of the digital isolator circuitry 206 is coupled to the second terminal 204 of the isolated modulator circuit 200.

In operation, the isolated modulator circuit 200 operates to: receive an analog input signal at the first terminal 202; provide a digital output based on the analog input signal and the operations of the delta-sigma modulator circuit 100A or 100B; and isolate the digital output from a voltage domain of the isolated modulator circuit 200 using the digital isolator circuitry 206. In some examples, the digital output is a stream of 1-bit digital values.

In some examples, the isolated modulator circuit 200 is a stand-alone integrated circuit (IC). In other examples, the isolated modulator circuit 200 may be part of an IC that includes sense components, signal conditioning circuits (e.g., gain amplifiers and antialiasing filters), or other components.

FIG. 3 is a block diagram showing an example isolated amplifier circuit 300. The isolated amplifier circuit 300 has a first terminal 302 and a second terminal 304. The isolated amplifier circuit 300 includes the delta-sigma modulator circuit 100A or 100B, the digital isolator circuitry 206, and DAC and LPF circuitry 306. The delta-sigma modulator circuit 100A or 100B has the first terminal 102 and the second terminal described in FIGS. 1A and 1B. The digital isolator circuitry 206 has the first terminal 208 and the second terminal 210 described in FIG. 2. The DAC and LPF circuitry 306 has a first terminal 308 and a second terminal 310.

The first terminal 302 of the isolated amplifier circuit 300 is coupled to the first terminal 102 of the delta-sigma modulator circuit 100A or 100B. The second terminal 104 of the delta-sigma modulator circuit 100A or 100B is coupled to the first terminal 208 of the digital isolator circuitry 206. The second terminal 210 of the digital isolator circuitry 206 is coupled to the first terminal 308 of the DAC and LPF circuitry 306. The second terminal 310 of the of the DAC and LPF circuitry 306 is coupled to the second terminal 304 of the isolated amplifier circuit 300.

In operation, the isolated amplifier circuit 300 operates to: receive an analog input signal at the first terminal 302; provide a digital output based on the analog input signal and the operations of the delta-sigma modulator circuit 100A or 100B; isolate the 1-bit modulation stream from a voltage domain of the isolated amplifier circuit 300 using the digital isolator circuitry 206; and convert the isolated digital output to an analog signal using the DAC and LPF circuitry 306. The input signal to DAC and LPF circuitry 306 has quantization noise at high frequencies. The LPF is required to filter this quantization noise. The order of the LPF may be chosen to be one order higher than the order of noise shaping on incoming bit-stream. In different examples, the LPF may be all continuous time filter or a combination of switched capacitor filter followed by continuous time filter.

In some examples, the isolated amplifier circuit 300 is a stand-alone IC. In other examples, the isolated amplifier circuit 300 may be part of an IC that includes sense components, signal conditioning circuits (e.g., gain amplifiers and antialiasing filters), or other components.

Figure 4:
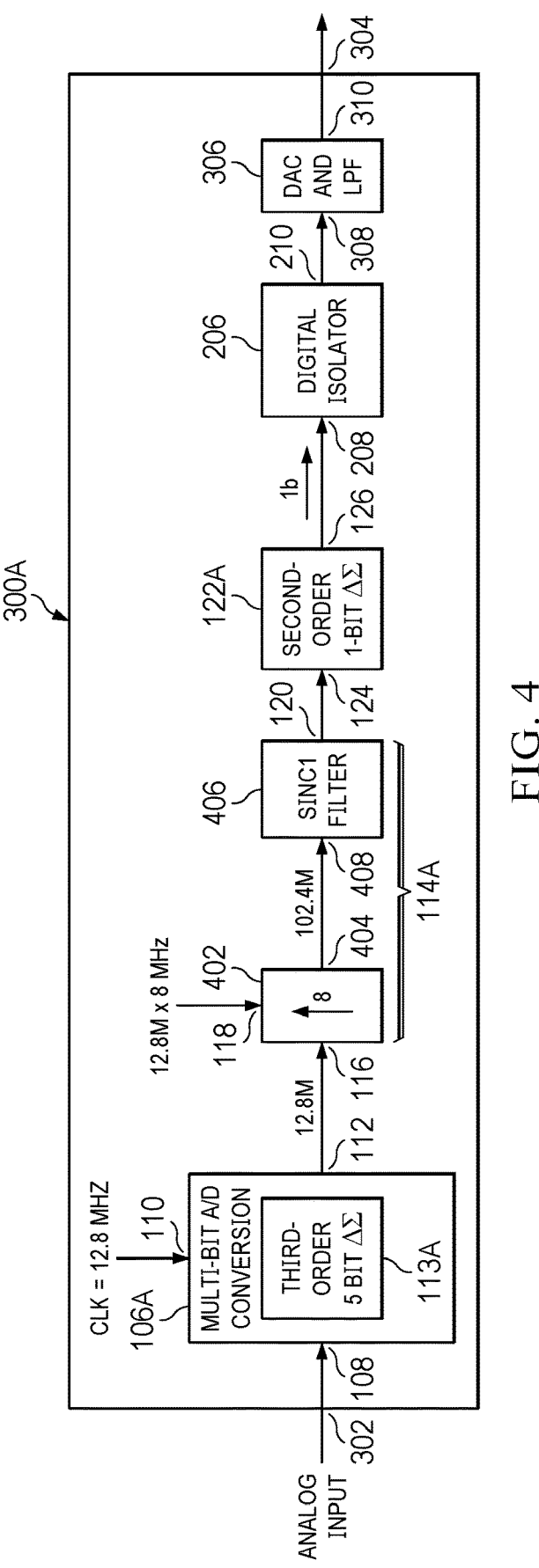
FIG. 4 is a block diagram showing another example isolated amplifier circuit.

FIG. 4 is a block diagram showing another example isolated amplifier circuit 300A. The isolated amplifier circuit 300A is an example of the isolated amplifier circuit 300. As shown, the isolated amplifier circuit 300A has the first terminal 302 and the second terminal 304 described in FIG. 3. The isolated amplifier circuit 300A includes a multi-bit analog-to-digital conversion circuitry 106A, interpolation circuitry 402, filter circuitry 406, a digital delta-sigma modulator 122A, the digital isolation circuitry 206, and the DAC and LPF circuitry 306. The multi-bit analog-to-digital conversion circuitry 106A is an example of the multi-bit analog-to-digital conversion circuitry 106 in FIG. 1A. In the example of FIG. 4, the multi-bit analog-to-digital conversion circuitry 106A includes a third-order 5-bit delta-sigma modulator 113A. The third-order 5-bit delta-sigma modulator 113A is an example of the Nth order m-bit delta-sigma modulator 113 of FIG. 1A The interpolation circuitry 402 and the filter circuitry 406 are example components of interpolation and filter circuitry 114A. The interpolation and filter circuitry 114A is an example of the interpolation and filter circuitry 114 in FIG. 1A. The digital delta-sigma modulator 122A is an example of the digital delta-sigma modulator 122 in FIG. 1A. In the example of FIG. 4, the digital delta-sigma modulator 122A is a second-order 1-bit digital delta-sigma modulator.

As shown, the multi-bit analog-to-digital conversion circuitry 106A has the first terminal 108, the second terminal 110, and the third terminal 112 described in FIG. 1A. The interpolation circuitry 402 has the first terminal 116, the second terminal 118, and a third terminal 404. The filter circuitry 406 has a first terminal 408 and the third terminal 120. The digital delta-sigma modulator 122A has the first terminal 124 and the second terminal 126. The digital isolator circuitry 206 has the first terminal 208 and the second terminal 210. The DAC and LPF circuitry 306 has the first terminal 308 and the second terminal 310.

In the example of FIG. 4, the first terminal 302 of the isolated amplifier circuit 300A is coupled to the first terminal 108 of the multi-bit analog-to-digital conversion circuitry 106A. The second terminal 110 of the multi-bit analog-to-digital conversion circuitry 106A is coupled to a clock generator (not shown) and receives CLK. In the example of FIG. 4, CLK=12.8 MHz. The third terminal 112 of the multi-bit analog-to-digital conversion circuitry 106A is coupled to the first terminal 116 of the interpolation circuitry 402. The second terminal 118 of the interpolation circuitry 402 is coupled to a clock generator or multiplier (not shown) and receives CLK*L. In the example of FIG. 4, L=8 and CLK*8=102.4 MHz. The third terminal of the interpolation circuitry 402 is coupled to the first terminal 408 of the filter circuitry 406. In some examples, the filter circuitry 406 is a sinc1 filter. As used herein, a sinc1 filter refers to a moving average filter. In other examples, the filter circuitry 406 may be higher order to provide better image rejection. The third terminal 120 of the filter circuitry 406 is coupled to the first terminal 124 of the digital delta-sigma modulator 122A. The second terminal 126 of digital delta-sigma modulator 122A is coupled to the first terminal 208 of the digital isolator circuitry 206. The second terminal 210 of the digital isolator circuitry 206 is coupled to the first terminal 308 of the DAC and LPF circuitry 306. The second terminal 310 of the DAC and LPF circuitry 306 is coupled to the second terminal 304 of the isolated amplifier circuit 300A.

The isolated amplifier circuit 300A operates to: receive an analog input signal at the first terminal 302; convert the analog input signal to a modulation signal using the multi-bit analog-to-digital conversion circuitry 106A; and interpolate the modulation signal using the interpolation circuitry 402 to obtain interpolation results. The isolated amplifier circuit 300A also operates to: filter the interpolation results using the filter circuitry 406 to obtain filtered results; convert the filtered results to a digital output using the digital delta-sigma modulator 122A; isolate the digital output using the digital isolator circuitry 206; amplify and filter the isolated digital stream using the DAC and LPF circuitry 306; and provide the amplified and filtered results from the DAC and LPF circuitry 306 to the second terminal 304 as the output of the isolated amplifier circuit 300A.

In some scenarios, the incoming bit-stream to the DAC and LPF circuitry 306 has quantization noise at high frequencies. The LPF of the DAC and LPF circuitry 306 is used to filter this quantization noise. The order of the LPF may be chosen to be one order higher than the order of noise shaping of the incoming bit-stream. In some examples, the LPF may be a continuous-time filter or a combination of a switched-capacitor filter followed by a continuous-time filter.

In some examples, the delta-sigma modulator circuit 100A or 100B provides a single-bit modulator output at high frequencies to increase the usable bandwidth. A multi-bit modulator output for the delta-sigma modulator circuit 100A or 100B necessitates multiple digital isolators, which increases cost. By combining multi-bit A/D conversion circuitry 106 or 128 with the interpolation and filter circuitry 114 and the digital delta-sigma modulator 122, a low-cost high-speed delta-sigma modulator with usable bandwidth is achieved. Without limitation, the number of bits for the Nth order m-bit delta-sigma modulator 113 may be 2 to 5 in some examples. With higher numbers of bits for the Nth order m-bit delta-sigma modulator 113, the usable bandwidth increases. With higher order for the Nth order m-bit delta-sigma modulator 113, usable bandwidth may also increase by shaping out quantization noise. Without limitation, the Nth order m-bit delta-sigma modulator 113 may be 5th order or lower m-bit delta-sigma modulator for stability.

The interpolation factor L may vary depending on the number of bits provided by the multi-bit A/D conversion circuitry 106 and the order of noise shaping used by the digital delta-sigma modulator 122. As the number of bits provided by the multi-bit A/D conversion circuitry 106 increases and as lower order noise shaping is used in the digital delta-sigma modulator 122, L increases. There is also a practical limit on the digital isolator date rate which may put an upper bound on L. As an example, for a 3rd order 5-bit delta-sigma modulator, L=8 may limit the useful bandwidth of both analog and digital components of a delta-sigma modulator. With L=16, the digital delta-sigma modulator 122 has negligible impact on quantization noise and useful bandwidth is limited only by analog modulator (e.g., the Nth order m-bit delta-sigma modulator 113). The choice of interpolation factor L and filter may vary depending on a particular image rejection target. A higher order interpolation and filter provides better image rejection but adds more delay. Additional image rejection may be obtained using low pass filtering after the digital isolator circuitry 206. Compared to delta-sigma modulator circuit 100B, the image rejection performance of the delta-sigma modulator circuit 100A is improved.

Figure 5:
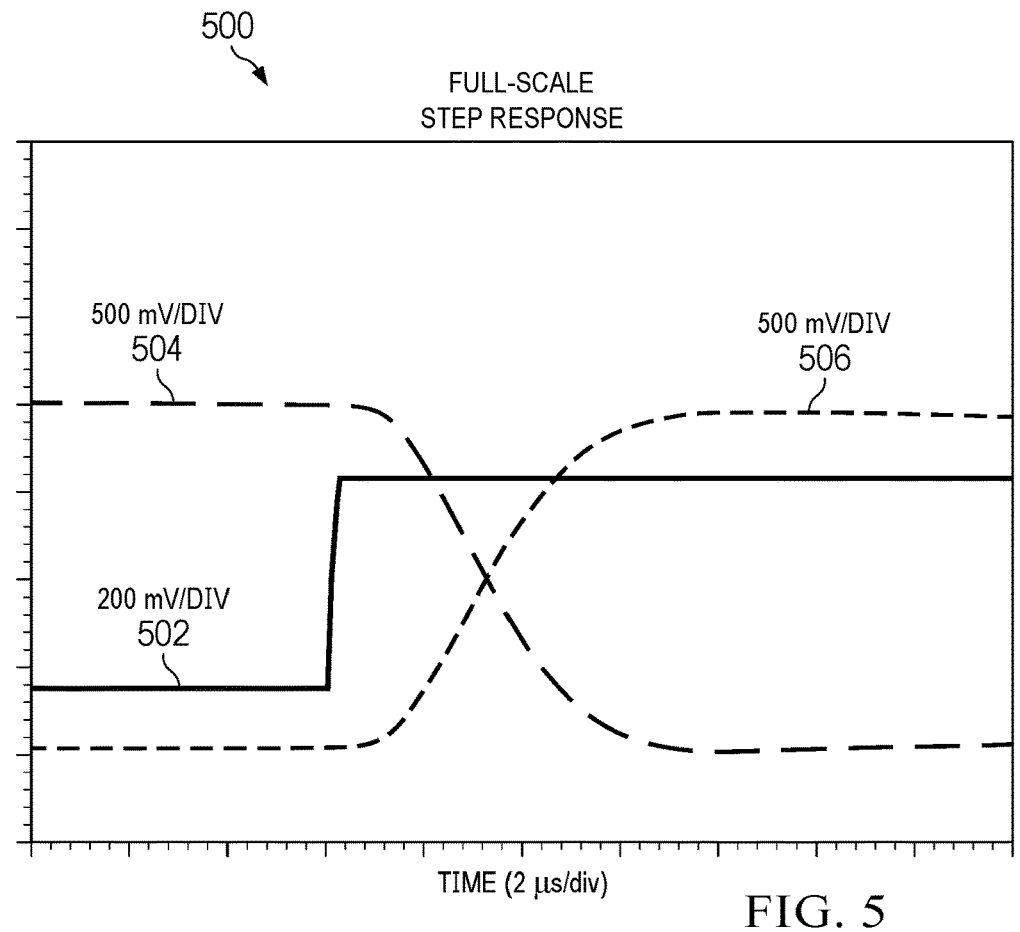
FIG. 5 is a graph showing an example full-scale step response of an isolated amplifier circuit.

FIG. 5 is a graph 500 showing an example full-scale step response of an isolated amplifier circuit (e.g., the isolated amplifier circuit 300 of FIG. 3, or the isolated amplifier circuit 300A in FIG. 4). In the graph 500, signal 502 is a differential input signal, and signals 504 and 506 are single-ended outputs on the opposite side of isolation relative to the signal 502. In some examples, the signal 502 rides on a common mode voltage (not shown). In some examples, the common mode voltage may have a large peak (e.g., 1 kV peak). In the example of FIG. 5, an isolated amplifier circuit provides amplification of the differential mode, and rejection and isolation for the common mode. The goal of using the delta-sigma modulator circuit 100A or 100B with an isolated modulator or isolated amplifier is to reduce latency or delay (improving bandwidth) while maintaining a target SNR.

Figure 6:
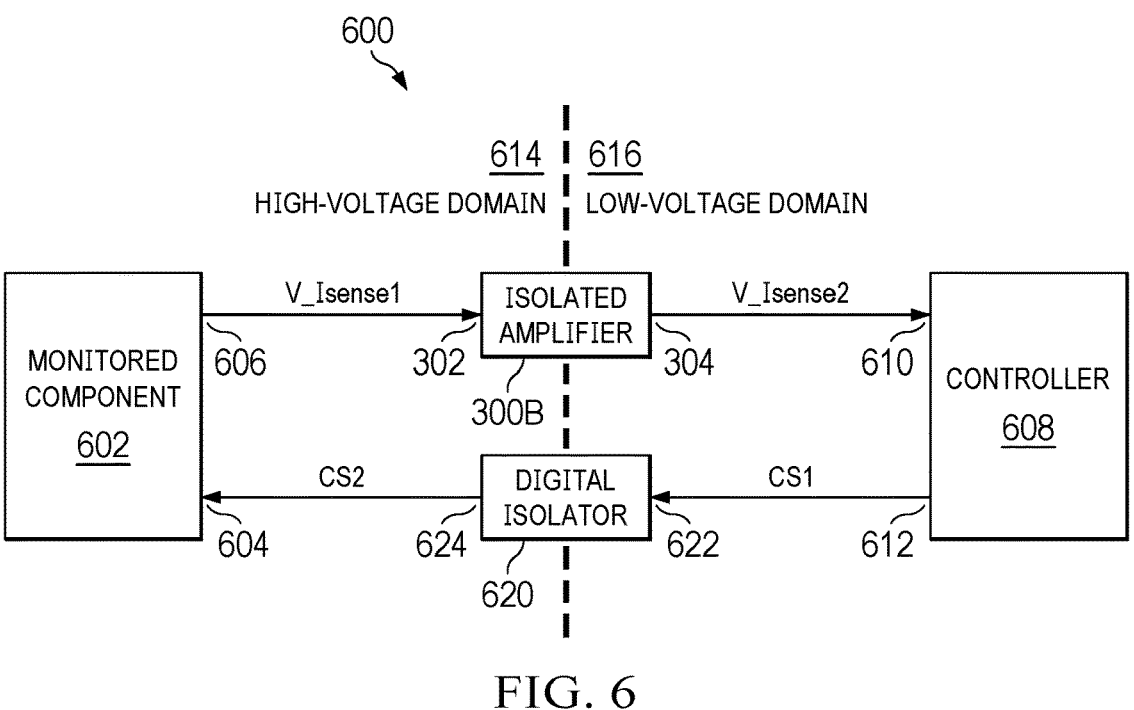
FIG. 6 is a block diagram of an example system.

FIG. 6 is a block diagram of an example system 600. As shown, the system 600 includes a monitored component 602, an isolated amplifier circuit 300B, a controller 608, and a digital isolator circuit 620. The isolated amplifier circuit 300B is an example of the isolated amplifier circuit 300 in FIG. 3, or the isolated amplifier circuit 300A in FIG. 4. The monitored component 602 has a first terminal 604 and a second terminal 606. The isolated amplifier circuit 300B has the first terminal 302 and the second terminal 304. The controller 608 has a first terminal 610 and a second terminal 612. The digital isolator circuit 620 has a first terminal 622 and a second terminal 624. In the example of FIG. 6, the monitored component 602 and the isolated amplifier circuit 300B is part of a high-voltage domain 614 (e.g., the ground of the high-voltage domain 614 may vary from the ground of the low-voltage domain 616 by 1 kV), and the controller 608 is part of a low-voltage domain 616 (e.g., 3-5V). The isolation amplifier circuit 300B and the digital isolator circuit 620 provide a signaling interface between the high-voltage domain 614 and the low-voltage domain 616.

As shown, the first terminal 604 of the monitored component 602 is coupled to the second terminal 624 of the digital isolator circuit 620. The second terminal 606 of the monitored component 602 is coupled to the first terminal 302 of the isolated amplifier circuit 300B. The second terminal 304 of the isolated amplifier circuit 300B is coupled to the first terminal 610 of the controller 608. The second terminal 612 of the controller 608 is coupled to the first terminal 622 of the digital isolator circuit 620.

The monitored component 602 operates to: receive a control signal (CS2, which is based on CS1) at the first terminal 604; perform operations responsive to CS2; and provide a first sense signal (e.g., V_Isense1) at the second terminal 606. Due to the high-voltage domain 614 and the low-voltage domain 616, CS2 is provided to the monitored component 602 via the digital isolator circuit 620. During operations of the monitored component based on CS2, the monitored component 602 generates a first sense signal (e.g., V_Isense1) at the second terminal 606. The first sense signal may be a current sense signal or a voltage sense signal. In some examples, the first sense signal is combined with (rides on) a common mode voltage. In the example of FIG. 6, the first sense signal from the monitored component 602 is within a voltage supply range of the isolation amplifier circuit 300B.

The isolated amplifier circuit 300B operates to: receive the first sense signal at the first terminal 302; isolate the first sense signal from the high-voltage domain 614 to the low-voltage domain 616; and amplify the first sense signal in the low-voltage domain 616, resulting in a second sense signal (e.g., V_Isense2) based on the first sense signal. In the example of FIG. 6, the second sense signal is conveyed to the controller 608 in the low-voltage domain 616. The controller 608 operates to: receive the second sense signal at the first terminal 610; adjust a control signal (CS1) based on the second sense signal; and provide the adjusted CS1 at the second terminal 612. The digital isolator circuit 620 operates to: receive CS1 at the first terminal 622; isolate CS1 from the low-voltage domain 616 to the high-voltage domain 614, resulting in CS2 based on CS1; and provide CS2 in the high-voltage domain 614 to the monitored component 602. Over time, control of the monitored component 602 is adjusted as needed. In some examples, the monitored component 602 is a motor and the control signal (e.g., CS1 and/or CS2) from the controller 608 is a current for the motor, where the control signal (e.g., CS1 and/or CS2) is adjusted responsive to a load, temperature, and/or other parameters.

In some examples, the first and second sense signals (e.g., V_Isense1 and/or V_Isense2) provide phase current information, and the control signal (e.g., CS1 and/or CS2) is a pulse-width modulation (PWM) control signal or resulting power signal responsive to the phase current being monitored. During control operations, the latency of monitoring phase currents affects the motor regulation loop. With a lower latency (higher-speed) isolated modulator (e.g., the isolated modulator circuit 200 in FIG. 2) or isolated amplifier (e.g., the isolated amplifier circuit 300 in FIG. 3, or the isolated amplifier circuit 300A in FIG. 4), a motor regulation loop or other feedback control loop has reduced latency and may benefit from a higher switching frequency and improved response times. In different examples, the shape, frequency, and/or amplitude of sense signals provided to an isolated modulator or isolated amplifier may vary.

FIG. 7 is a flowchart showing an example method 700. The method 700 may be performed by a delta-sigma modulator (e.g., the delta-sigma modulator circuit 100A in FIG. 1A, the delta-sigma modulator circuit 100B in FIG. 1B) or related products (e.g., an isolated modulator or an isolated amplifier). In the example of FIG. 7, the method 700 includes converting an analog input signal to a multi-bit modulation signal responsive to a first clock at block 702. At block 704, the multi-bit modulation signal is interpolated responsive to a second clock, resulting in an interpolated signal. The second clock has a higher frequency than the first clock. At block 706, the interpolated signal is filtered to a provide a filtered signal. At block 708, the filtered signal is noise shaped using a digital delta-signal modulator to provide a digital output.

In some examples, a circuit includes: multi-bit analog-to-digital conversion circuitry (e.g., the multi-bit analog-to-digital conversion circuitry 106 in FIG. 1A, the multi-bit analog-to-digital conversion circuitry 128 in FIG. 1B, or related circuitry); an interpolation circuit (e.g., part of the interpolation and filter circuitry 114 in FIGS. 1A and 1B, or the interpolation circuitry 402 in FIG. 4); a filter (e.g., part of the interpolation and filter circuitry 114 in FIGS. 1A and 1B, or the filter circuitry 406 in FIG. 4); and a digital delta-sigma modulator (e.g., the digital delta-sigma modulator 122 in FIGS. 1A and 1B or the digital delta-sigma modulator 122A in FIG. 4). The multi-bit analog-to-digital conversion circuitry has a first terminal (e.g., the first terminal 108 in FIG. 1A, or the first terminal 130 in FIG. 1B) and a second terminal (e.g., the third terminal 112 in FIG. 1A, or the third terminal 134 in FIG. 1B). The interpolation circuit has a first terminal (e.g., the first terminal 116 in FIG. 4) and a second terminal (e.g., the third terminal 404 in FIG. 4). The first terminal of the interpolation circuit is coupled to the second terminal of the multi-bit analog-to-digital conversion circuitry. The filter has a first terminal (e.g., the first terminal 408 in FIG. 4) and a second terminal (e.g., the third terminal 120 in FIG. 4). The first terminal of the filter is coupled to the second terminal of the interpolation circuit. The digital delta-sigma modulator has a first terminal (e.g., the first terminal 124 in FIGS. 1A, 1B, and 4) and a second terminal (e.g., the second terminal 126 in FIGS. 1A, 1B, and 4). The first terminal of the digital delta-sigma modulator is coupled to the second terminal of the filter.

In some examples, the multi-bit analog-to-digital conversion circuitry includes a Nth order m-bit delta-sigma modulator (e.g., the Nth order m-bit delta-sigma modulator 113 in FIG. 1A), where N and m are integers greater than 1. In some examples, the delta-sigma modulator is a 3rd order 5-bit delta-sigma modulator and the digital delta-sigma modulator is a 2nd order 1-bit digital delta-sigma modulator. In some examples, the multi-bit analog-to-digital conversion circuitry includes a Nyquist rate ADC (e.g., the Nyquist rate ADC 135 in FIG. 1B) that provides a multi-bit output in one clock period. In some examples, the Nyquist rate ADC is an SAR ADC. Without limitation, the multi-bit analog-to-digital conversion circuitry may be clocked at a rate of 10 Mhz to 20 MHz, while the interpolation circuit is clocked at a rate of 80 MHz to 160 MHz.

In some examples, the circuit includes isolation circuitry (e.g., the digital isolator circuitry 206 in FIGS. 2 to 4) having a first terminal (e.g., the first terminal 208 in FIGS. 2 to 4) and a second terminal (e.g., the second terminal 210 in FIGS. 2 to 4). The first terminal of the isolation circuitry is coupled to the second terminal of the digital delta-sigma modulator. In some examples, the isolation circuitry is coupled to the digital delta-sigma modulator isolates a digital output of the digital delta-sigma modulator between different ground potentials.

In some examples, the multi-bit analog-to-digital conversion circuitry, the interpolation circuit, the filter, the digital delta-sigma modulator, and the isolation circuitry are components of a stand-alone isolated modulator integrated circuit. In some examples, the circuit includes DAC and LPF circuitry (e.g., the DAC and LPF circuitry 306 in FIGS. 3 and 4) having a first terminal (e.g., the first terminal 308 in FIGS. 3 and 4) and a second terminal (e.g., the second terminal 310 in FIGS. 3 and 4). The first terminal of the DAC and LPF circuitry is coupled to the second terminal of the isolation circuitry. In some examples, the DAC and LPF circuitry converts the digital output from digital isolation circuitry to a filtered analog signal. In some examples, the multi-bit analog-to-digital conversion circuitry, the interpolation circuit, the filter, the digital delta-sigma modulator, the isolation circuitry, and the digital-to-analog converter and low-pass filter circuitry are components of a stand-alone isolated amplifier integrated circuit.

In some examples, the circuit includes: a monitored component (e.g., the monitored component 602 in FIG. 6); a controller (e.g., the controller 608 in FIG. 6); and a digital isolator circuit (e.g., the digital isolator circuit 620 in FIG. 6). The monitored component has a first terminal (e.g., the first terminal 604 in FIG. 6) and a second terminal (e.g., the second terminal 606 in FIG. 6). The controller has a first terminal (e.g., the first terminal 610 in FIG. 6) and a second terminal (e.g., the second terminal 612 in FIG. 6). The digital isolator circuit has a first terminal (e.g., the first terminal 622 in FIG. 6) and a second terminal (e.g., the second terminal 624 in FIG. 6). In such examples, the first terminal of the controller is coupled to the second terminal of digital-to-analog converter and low-pass filter circuitry. The second terminal of the controller is coupled to the first terminal of the digital isolator circuit. The second terminal of the digital isolator circuit is coupled to the first terminal of the monitored component. The second terminal of the monitored component is coupled to the first terminal of the multi-bit analog-to-digital conversion circuitry. In some examples, the monitored component is a motor.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

The invention claimed is:

1. A circuit comprising:
    multi-bit analog-to-digital conversion circuitry having a first terminal and a second terminal;
    an interpolation circuit having a first terminal and a second terminal, the first terminal of the interpolation circuit coupled to the second terminal of the multi-bit analog-to-digital conversion circuitry;
    a filter having a first terminal and a second terminal, the first terminal of the filter coupled to the second terminal of the interpolation circuit;
    a digital delta-sigma modulator having a first terminal and a second terminal, the first terminal of the digital delta-sigma modulator coupled to the second terminal of the filter; and
    isolation circuitry having a first terminal and a second terminal, the first terminal of the isolation circuitry coupled to the second terminal of the digital delta-sigma modulator.

2. The circuit of claim 1, wherein the multi-bit analog-to-digital conversion circuitry includes a Nth order m-bit delta-sigma modulator, where N and m are integers greater than 1.

3. The circuit of claim 2, wherein the delta-sigma modulator is a $3^{rd}$ order 5-bit delta-sigma modulator and the digital delta-sigma modulator is a $2^{nd}$ order 1-bit digital delta-sigma modulator.

4. The circuit of claim 1, wherein the multi-bit analog-to-digital conversion circuitry includes a Nyquist rate ADC that provides a multi-bit output in one clock period.

5. The circuit of claim 4, wherein the Nyquist rate ADC is a successive-approximation (SAR) ADC.

6. The circuit of claim 1, wherein the multi-bit analog-to-digital conversion circuitry, the interpolation circuit, the filter, the digital delta-sigma modulator, and the isolation circuitry are components of a stand-alone isolated modulator integrated circuit.

7. The circuit of claim 1, further comprising digital-to-analog converter and low-pass filter circuitry having a first terminal and a second terminal, the first terminal of the digital-to-analog converter and low-pass filter circuitry coupled to the second terminal of the isolation circuitry.

8. The circuit of claim 7, wherein the multi-bit analog-to-digital conversion circuitry, the interpolation circuit, the filter, the digital delta-sigma modulator, the isolation circuitry, and the digital-to-analog converter and low-pass filter circuitry are components of a stand-alone isolated amplifier integrated circuit.

9. The circuit of claim 7, further comprising a monitored component, a controller, and a digital isolator circuit, the monitored component having a first terminal and a second terminal, the controller having a first terminal and a second terminal, digital isolator circuit having a first terminal and a second terminal, the first terminal of the controller coupled to the second terminal of the digital-to-analog converter and low-pass filter circuitry, the second terminal of the controller coupled to the first terminal of the digital isolator circuit, the second terminal of the digital isolator circuit coupled to the first terminal of the monitored component, the second terminal of the monitored component coupled to the first terminal of the multi-bit analog-to-digital conversion circuitry.

10. The circuit of claim 9, wherein the monitored component is a motor.

11. A circuit comprising:
a multi-bit delta-sigma modulator having a first terminal and a second terminal;
an interpolation circuit having a first terminal and a second terminal, the first terminal of the interpolation circuit coupled to the second terminal of the multi-bit delta-sigma modulator;
a filter having a first terminal and a second terminal, the first terminal of the filter coupled to the second terminal of the interpolation circuit;
a digital delta-sigma modulator having a first terminal and a second terminal, the first terminal of the digital delta-sigma modulator coupled to the second terminal of the filter; and
isolation circuitry having a first terminal and a second terminal, the first terminal of the isolation circuitry coupled to the second terminal of the digital delta-sigma modulator.

12. The circuit of claim 11, further comprising digital-to-analog converter and low-pass filter circuitry having a first terminal and a second terminal, the first terminal of the digital-to-analog converter and low-pass filter circuitry coupled to the second terminal of the isolation circuitry.

13. The circuit of claim 11, wherein the multi-bit delta-sigma modulator is a Nth order m-bit delta-sigma modulator, where N and m are integers greater than 1.

14. The circuit of claim 11, wherein the multi-bit delta-sigma modulator is a $3^{rd}$ order 5-bit delta-sigma modulator and the digital delta-sigma modulator is a $2^{nd}$ order 1-bit digital delta-sigma modulator.

15. A circuit comprising:
multi-bit analog-to-digital conversion circuitry configured to convert an analog input signal to a multi-bit signal;
an interpolation circuit coupled to the multi-bit analog-to-digital conversion circuitry and configured to interpolate the multi-bit signal, resulting in an interpolated signal;
a filter coupled to the interpolation circuit and configured to filter the interpolated signal, resulting in a filtered signal;
a digital delta-sigma modulator coupled to the filter and configured to digitize the filtered signal; and
isolation circuitry coupled to the digital delta-sigma modulator and configured to isolate a digital output of the digital delta-sigma modulator between different ground potentials.

16. The circuit of claim 15, wherein the multi-bit analog-to-digital conversion circuitry includes a $3^{rd}$ order 5-bit delta-sigma modulator and the digital delta-sigma modulator is a $2^{nd}$ order 1-bit digital delta-sigma modulator.

17. The circuit of claim 15, wherein the multi-bit analog-to-digital conversion circuitry includes a Nyquist rate analog-to-digital converter (ADC) that provides a multi-bit output in one clock period.

18. The circuit of claim 15, further comprising digital-to-analog converter and low-pass filter circuitry coupled to the isolation circuitry and configured to convert the digital output to a filtered analog signal.

19. The circuit of claim 17, wherein the Nyquist rate ADC is a successive-approximation (SAR) ADC.

20. The circuit of claim 15, wherein the multi-bit analog-to-digital conversion circuitry, the interpolation circuit, the filter, the digital delta-sigma modulator, and the isolation circuitry are part of a stand-alone integrated circuit.

*   *   *   *   *